US006861479B2

(12) United States Patent
Sezi

(10) Patent No.: US 6,861,479 B2
(45) Date of Patent: Mar. 1, 2005

(54) COMPOSITION AND PROCESS FOR THE PRODUCTION OF A POROUS LAYER USING THE COMPOSITION

(75) Inventor: Recai Sezi, Röttenbach (DE)

(73) Assignee: Infineon Technologies AG, Munich (DE)

( * ) Notice: Subject to any disclaimer, the term of this patent is extended or adjusted under 35 U.S.C. 154(b) by 121 days.

(21) Appl. No.: 10/180,438

(22) Filed: Jun. 26, 2002

(65) Prior Publication Data

US 2002/0198277 A1 Dec. 26, 2002

(30) Foreign Application Priority Data

Jun. 26, 2001 (DE) .......................................... 101 30 601

(51) Int. Cl.$^7$ .......................... C08L 59/00; C08L 67/00; C08L 69/00; C08L 71/00; C08L 77/06
(52) U.S. Cl. ....................... 525/400; 525/408; 525/411; 525/413; 525/414; 525/415; 525/423; 525/425; 525/427; 525/428; 525/430
(58) Field of Search ................................ 525/400, 408, 525/411, 413, 414, 415, 423, 425, 427, 428, 430

(56) References Cited

U.S. PATENT DOCUMENTS 5,776,990 A 7/1998 Hedrick et al.
6,410,677 B1 * 6/2002 Enoki et al. ................. 528/170

FOREIGN PATENT DOCUMENTS

| EP | 1 085 041 | 3/2001 |
| EP | 1 088 848 | 4/2001 |
| JP | 63 278 943 | 11/1988 |
| JP | 2001098224 A2 | 4/2001 |
| WO | WO 00/05297 | 2/2000 |
| WO | WO 00/61834 | 10/2000 |

* cited by examiner

*Primary Examiner*—Ana Woodward
(74) *Attorney, Agent, or Firm*—Laurence A. Greenberg; Werner H. Stemer; Gregory L. Mayback

(57) ABSTRACT

Production of a porous layer includes using a composition which includes a first polymer component and a second polymer component, the first polymer component being polyhydroxyamide and/or polybenzoxazole and stable at a temperature at which the second polymer component decomposes and volatilizes. If the composition is heated to the decomposition temperature of the second polymer component, the second component volatilizes and a porous layer that contains the first component remains.

10 Claims, 2 Drawing Sheets

COMPOSITION AND PROCESS FOR THE PRODUCTION OF A POROUS LAYER USING THE COMPOSITION

BACKGROUND OF THE INVENTION

Field of the Invention

The present invention relates to a chemical composition and a process for the production of a porous layer using the chemical composition.

Porous layers are suitable, for example, for vibration insulation, for sound insulation, and as electric insulation layers. If the porous layer is used as an insulation layer, the signal transit time of a line insulated by the porous layer can be shortened by forming the insulating layer with a low dielectric constant. If, in a nonporous embodiment, the insulating layer has a dielectric constant with a first value, the value for the dielectric constant of a porous layer formed from the same material is less than the first value because the gas, for example, air or nitrogen, or a vacuum introduced into the pores reduces the dielectric constant to a value closer to 1.

For example, the signal transit time in metallization planes of integrated circuits can be reduced thereby. This is of decisive importance for the efficiency of the integrated circuit. Particularly in the case of future chip generations, the signal transit time of the electrical connecting lines will decisively contribute to the overall efficiency of the integrated circuit because the length of the metal-like conductor tracks is constantly increasing. To counteract the resultant increasing total resistance of the conductor tracks, conductor tracks of present-day logic chips are no longer produced only from aluminum but also from copper, because copper has a lower electrical resistance than aluminum. Furthermore, copper has poorer electromigration properties compared with aluminum.

However, the signal transit time of an electrical conductor is influenced not only by its resistance but also by the dielectric constant of the insulator that is disposed between adjacent conductor tracks. The lower the value of the dielectric constant, the shorter is the signal transit time, which to a first approximation is correlated with the product of the resistance of the conductor and the capacitance of the insulator. For subsequent chip generations, preferably, materials that have a dielectric constant of less than 2.5 will be disposed as an insulator between different metallization planes of a semiconductor chip.

The materials used in chip technology as an insulator between different metallization planes must fulfill a number of important criteria. For example, thermal stability at temperatures greater than or equal to 450° C. and low moisture absorption of less than 0.5% as well as very good adhesion of the material to the substrate are required. Further criteria are simple and economical preparation of the material because the material costs play a major role in chip production.

For example, the publication U.S. Pat. No. 5,776,990 to Hedrick et al. discloses materials that are suitable as insulation between metallization planes of an integrated circuit. Hedrick describes copolymers that contain stable and labile blocks in the copolymer. Through the decomposition of the labile block at elevated temperature, pores can be produced. As a result, the dielectric constant of the material is reduced. This process is referred to as foaming, it being possible for the value of the dielectric constant to be substantially reduced. However, the block copolymers and graft copolymers described in Hedrick have the disadvantage that they require a fresh synthesis for each necessary or desired ratio of labile to stable block. In many cases, toxic materials, such as phosgene or cresol, must be employed for such a purpose. Another disadvantage is that a different copolymer having the corresponding proportions must be synthesized for each application that requires a different pore size and for each intended use. This is required, for example, for insulation layers between metal wiring planes or for materials for absorption of acoustic waves. At the end of the synthesis, the copolymer must additionally be precipitated or purified and dried. Only thereafter is the preparation of the final solution for use for the production of the insulation layer or absorption layer carried out. This effort is associated with correspondingly high costs.

Japanese Patent Document JP 63278943 A discloses a process for the production of a porous body, in which a fluorinated resin or polyimide resin, as a heat-resistant polymer, is mixed with thermally decomposable polymers, such as polycarbonates. By heating such a mixture to a temperature above the decomposition temperature of the decomposable polymers, a porous body can be obtained. The disadvantage is that this polyimide-containing porous body absorbs water, which results in a disadvantageous increase in the dielectric constant.

SUMMARY OF THE INVENTION

It is accordingly an object of the invention to provide composition and process for the production of a porous layer using the composition that overcomes the hereinaforementioned disadvantages of the heretofore-known devices and methods of this general type and that simplifies the technical requirements and process steps, reduces the costs for the production of the porous layer, and allows the porous layer to simultaneously have a permanently low dielectric constant.

With the foregoing and other objects in view, there is provided, in accordance with the invention, a composition for the production of a dielectric, porous layer, including a mixture of at least one first polymer component and at least one second polymer component, the first component being selected from the group consisting of polyhydroxyamide and polybenzoxazole and the second component being decomposable and volatilizable at temperatures at which the first component is stable.

The decomposition temperature of the second polymer component is, thus, in a temperature range in which the first component is still stable. In the context of the invention, stable second polymer components is to be understood as meaning polymers that do not decompose and volatilize at the decomposition temperature of the first polymer component but may possibly react chemically with retention of at least the major part of their molecular skeleton, for example, by intramolecular and possibly intermolecular cyclizations or condensations.

The first, thermally stable polymer component according to the invention is poly(hydroxyamide) and/or polybenzoxazole. These two polymers are particularly suitable because, on one hand, they are stable to many reagents used in integrated circuits, for example, acids, such as HF, and, on the other hand, they can ensure a permanently low dielectric constant of the porous layer. Many other, thermally stable polymers, e.g., polyimides, can absorb water, which results in an increase in the dielectric constant. In the context of the invention, poly(hydroxyamides) are polymers that were prepared by polymerization of a bisaminophenol with a dicarboxylic acid or of a dicarboxylic acid derivative (acid chloride or ester), the monomers being linked to one another by amide bonds. The poly(hydroxyamides) according to the invention may also include different dicarboxylic acids and/or aminophenols. Polybenzoxazoles have benzoxazole units and can be prepared, for example, from poly (hydroxyamides).

The composition according to the invention furthermore has the advantage that a complicated synthesis of a copolymer, which has to be carried out afresh each time for each intended use, can be dispensed with. Instead, a composition that includes a first polymer component and a second polymer component is used, these components being mixed with one another.

In addition, it is possible to use a solvent in which the first and the second polymer component can be dissolved or dispersed. Such use has the advantage that, depending on the application, the two polymer components can be conveniently mixed on site or the mixed component can be obtained directly in the preferred mixing ratio. Even if the composition is obtained in the preferred mixing ratio, the mixing ratio of the polymer components can readily be changed to the desired mixing ratio by adding one or other polymer component. If, consequently, the first and the second polymer components are prepared by a corresponding preparation process, they can be subsequently mixed in the desired mixing ratio. As such, there is an enormous reduction in the complexity of the synthesis. The two starting components can be prepared by optimized processes, which incorporate corresponding cost reduction.

Furthermore, those polymer components that have secondary or tertiary nitrogen atoms are suitable. The stated polymer components are oligomers or polymers and have at least five repeating monomer units.

Suitable thermally labile second polymer components are aliphatic polyethers, polyacetals, polyesters, or polycarbonates.

In accordance with another feature of the invention, one embodiment of the composition according to the invention envisages that the first and/or the second polymer component include at least one of the functional groups: COOH, $SO_3H$, $NH_2$, $NH-CH_3$, OH, or SH. Such functional groups are suitable for the compatibility of the polymer components and homogeneous pore formation.

In accordance with a further feature of the invention, the composition according to the invention envisages that the first polymer component includes a terminal COOH group and the second polymer component a terminal $NH_2$-group.

In accordance with an added feature of the invention, the composition according to the invention envisages that the second polymer component includes a polyether having terminal amino groups. A polyether having terminal amino groups is particularly suitable as the second polymer component.

In accordance with an additional feature of the invention, the composition according to the invention envisages that the first polymer component includes a polyhydroxyamide having terminal carboxyl groups. A polyhydroxyamide having terminal carboxyl groups is suitable as the first component because this compound is thermally stable. Furthermore, a first polymer component formed in this manner has the advantage that it can be converted into a polybenzoxazole at an elevated temperature by dehydration. Polybenzoxazoles are advantageously insoluble in a number of organic solvents and therefore particularly stable.

In accordance with yet another feature of the invention, the composition according to the invention envisages that the second polymer component includes poly(propylene glycol)-bis(2-aminopropyl ether). Such substance is advantageously suitable as the second component because it is decomposed and volatilizes at the first temperature. The second component can likewise have the corresponding functional groups. Poly(propylene glycol)-bis-(2-aminopropyl ether) is, for example, an aliphatic polyether having amino groups.

In accordance with yet a further feature of the invention, the first component is a polyhydroxyamide prepared from bisaminophenol 1 and isophthaloyl chloride.

With the objects of the invention in view, there is also provided a process for the production of a porous layer, including the steps of mixing a composition by adding at least one first polymer component and at least one second polymer component together, the first component being selected from the group consisting of polyhydroxyamide and polybenzoxazole, and the second component being decomposable and volatilizable at temperatures at which the first component is stable, applying the composition to a substrate, and forming the porous layer by heating the composition to a temperature at which the first component remains stable but the second component decomposes and forms decomposition products, at least some of the decomposition products being volatile and escaping from the composition. The porous layer being a dielectric, porous layer.

A process for the production of a porous layer using the abovementioned or advantageously formed composition, includes the steps of applying the composition to a substrate and heating the composition to a temperature at which the first polymer component remains stable but the second polymer component decomposes and forms decomposition products, at least some of which are volatile and escape from the composition, a porous layer being formed.

The process according to the invention has the advantage that a porous layer can be formed in a simple manner starting from a composition that contains a first polymer component and a second polymer component.

In accordance with yet an added mode of the invention, the composition is applied to the substrate by spin-coating or spraying or is applied by immersing the substrate in the composition. These process steps are advantageously suitable for applying the composition to the substrate.

In accordance with yet an additional mode of the invention, the composition is dried at a temperature between 80° C. and 130° C., preferably, at a temperature between 90° C. and 120° C. The drying process is advantageously suitable for improving the adhesion of the composition to the substrate and removing the major part of the solvent.

In accordance with again another mode of the invention, the composition be heated to a temperature between 250° C. and 480° C., preferably, to a temperature between 320° C. and 420° C., to form the porous layer.

During the heating, for example, the second polymer component decomposes and volatilizes. Furthermore, the heating is suitable for converting the polyhydroxyamide remaining in the layer into polybenzoxazole.

In accordance with again a further mode of the invention, the polyhydroxyamide is prepared from bisaminophenol 1. Bisaminophenol 1 is suitable as a starting material for a polyhydroxyamide that can be converted into polybenzoxazole at a temperature of about 400° C. The dicarboxylic acid used is advantageously isophthaloyl chloride.

In accordance with a concomitant mode of the invention, the composition is mixed with addition of the first component and/or the second component.

Other features that are considered as characteristic for the invention are set forth in the appended claims.

Although the invention is illustrated and described herein as embodied in composition and process for the production of a porous layer using the composition, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
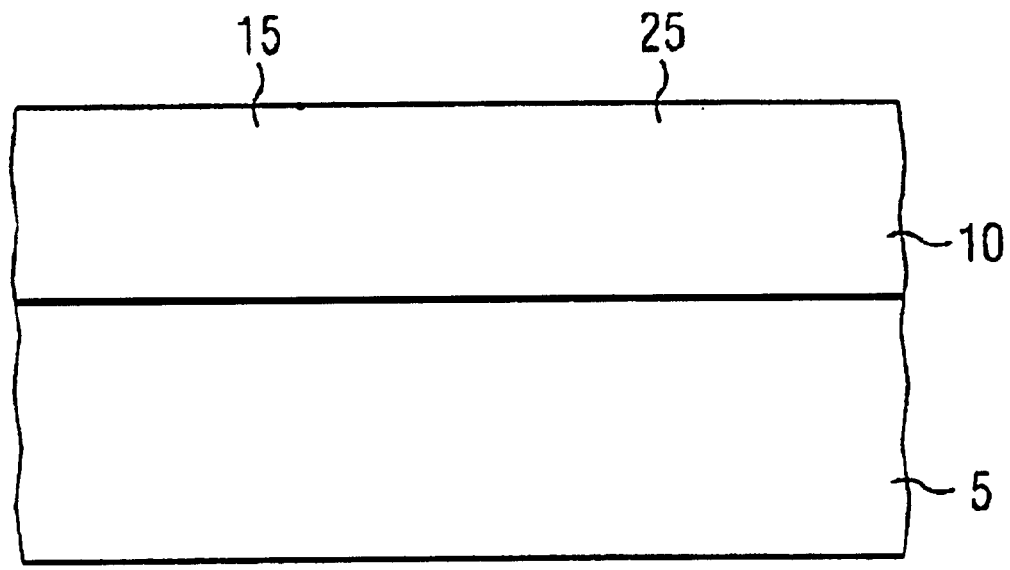
FIG. 1 is a fragmentary, cross-sectional view through a substrate on which the composition is applied according to the invention.

Referring now to the figures of the drawings in detail and first, particularly to FIG. 1 thereof, there is shown a substrate 5. A composition 10 is applied to the substrate 5. The composition 10 is applied, for example, by spin-coating or spraying on or by immersion. The composition 10 includes a first polymer component 15 and a second polymer component 25.

Figure 2:
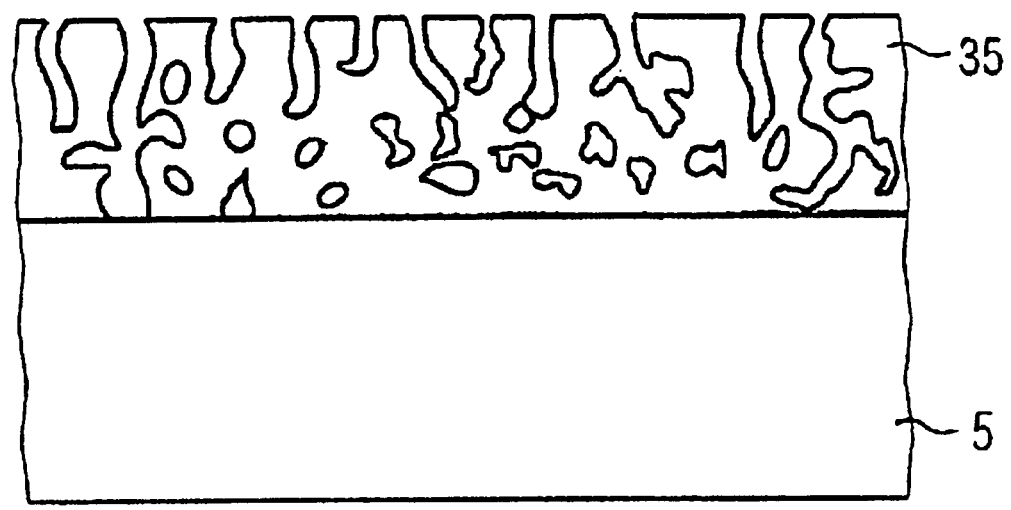
FIG. 2 is a fragmentary, cross-sectional view of the substrate of FIG. 1, the composition having been converted into a porous layer according to the invention.

FIG. 2 shows the section from FIG. 1, the composition 10 applied to the substrate 5 having been converted into a porous layer 35 by a heating step.

The composition 10 includes the first polymer component 15 and the second polymer component 25, the first polymer component including a polyhydroxyamide and/or a polybenzoxazole.

In a further embodiment, the first polymer component 15 and the second polymer component 20 include at least one of the functional groups COOH, $SO_3H$, $NH_2$, NH—$CH_3$—, OH or SH. It is advantageous if the first component 15 includes a terminal COOH group and the second component 25 a terminal $NH_2$ group. For example, a polyhydroxyamide having a terminal carboxyl group is suitable as the first component 15. A polyhydroxyamide having a terminal amino group is also suitable as the first component 25. A polycarbonate, polyacetal or aliphatic polyester or polyether, such as, for example, poly(propylene glycol)-bis-(2-aminopropyl ether), is suitable as the second component. Because the composition 10 includes the first component 15 and the second component 25 in a predetermined mixing ratio, salt formation can occur between the first component 15 and the second component 25.

In an advantageous embodiment of the invention, low molecular weight additives, such as, for example, monomeric compounds, which likewise contain functional groups, can be contained in the composition 10.

A process for the preparation of the first component 15 uses, for example, bisaminophenol 1 as a monomer.

Figure 3:
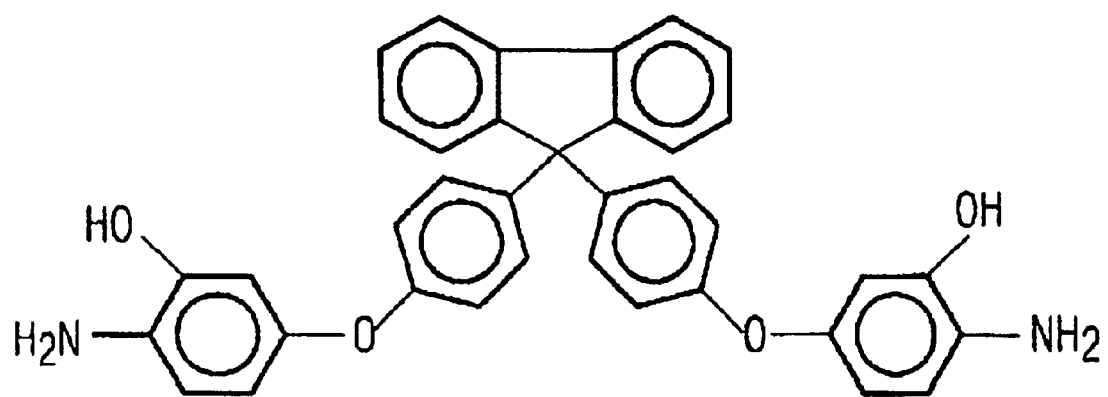
FIG. 3 is an illustration of a bisaminophenol suitable for the preparation of the composition according to the invention.

The bisaminophenol 1,9,9'-bis(4-((3-hydroxy-4-amino) phenoxy) phenylfluorene, is shown, for example, in FIG. 3. A process for the preparation of a suitable polyhydroxyamide having terminal carboxyl groups envisages that 56.4 g—corresponding to 0.1 mol—of bisaminophenol 1 be dissolved in 350 ml of distilled N-methylpyrrolidone (NMP). A solution of 24.4 g—corresponding to 0.12 mol—of isophthaloyl chloride in 200 ml of distilled γ-butyrolactone is added dropwise to the solution at 10° C. while stirring. Stirring is carried out for a further hour at 10° C. and then for three hours at 20° C. After further cooling to 10° C., 34.8 g—corresponding to 0.44 mol—of pyridine, dissolved in 300 ml of NMP, are added to the reaction mixture and the latter is heated to room temperature and stirred for a further two hours. To isolate the polymer, the reaction mixture is filtered and the filtrate is added dropwise to 5000 ml of a mixture of 2-propanol and water in a volume ratio of 1:1 with vigorous stirring. To complete the hydrolysis of terminal acid chlorides to the carboxylic acid, 11.2 g—corresponding to 0.2 mol—of potassium hydroxide, dissolved in 100 ml of distilled water, are added and stirring is effected for a further 14 hours at 23° C. Aqueous hydrochloric acid is then added until the liquid is neutral, which can be checked by a pH test. The precipitated polymer is filtered off with suction and washed once in 2000 ml of cold, demineralized water and once in 2000 ml of demineralized water at 80° C., filtered off, and dried for 72 hours at 50° C. and a pressure of 10 mbar. As a result of the excess of acid chloride, a polyhydroxyamide having terminal COOH groups forms and may be regarded as a precursor of polybenzoxazole.

A process for the preparation of a conventional copolymer as a comparative material envisages that 56.4 g—corresponding to 0.1 mol—of bisaminophenol 1 be dissolved in 350 ml of distilled N-methylpyrrolidone (NMP). A solution of 22.3 g—corresponding to 0.11 mol—of isophthaloyl chloride in 200 ml of distilled γ-butyrolactone (γ-BL) is added dropwise to this solution at 10° C. while stirring. Stirring is then carried out for one hour at 10° C. and subsequently for one hour at 20° C. Thereafter, the mixture is cooled again to 10° C. and a solution of 20 g—corresponding to 0.01 mol—of poly(propylene glycol)-bis-(2-aminopropyl ether) having a molar mass of 2000 (Sigma-Aldrich-Chemie GmbH) in 80 ml of distilled NMP is added dropwise. After the addition of 34.8 g—corresponding to 0.44 mol—of pyridine in 100 ml of NMP, the reaction solution is stirred for a further 1.5 hours at about 10° C. and then for 12 hours at about 20° C. To isolate the copolymer, the reaction mixture is filtered and the filtrate is added dropwise to 5000 ml of a mixture of 2-propanol and water in a volume ratio of 1:1 with vigorous stirring. The precipitated copolymer is filtered off with suction and washed twice in 1000 ml portions of cold, demineralized water and once in 2000 ml of demineralized water at 80° C., filtered off, and dried for 72 hours at 50° C. and a pressure of 10 mbar.

A process according to the invention for the formation of the porous layer 35 on the substrate 5 envisages that 35 g of the first polymer component 15, corresponding to the polyhydroxyamide prepared above and having a terminal carboxyl group, be dissolved together with 10 g of poly(propylene glycol)-bis-(2-aminopropyl ether) having a molar mass of 2000 as the second polymer component 25 in 160 g of NMP. After the filtration of the solution under pressure, through a 0.2 μm filter, the solution is applied to a substrate, such as, for example, a silicon wafer, by the spin-coating technique for 20 seconds at 2000 rpm. The film formed is then dried first for 60 seconds at 20° C. and then for about 120 seconds at 120° C. on a hotplate. After the drying, the layer is heated to convert the polyhydroxyamide into polybenzoxazole and to decompose the poly(propylene glycol)-bis-(2-aminopropyl ether). For such a purpose, the substrate 5 coated with the composition 10 is introduced into a controllable oven and heated to 400° C. The heating rate is about 3° C. per minute, a nitrogen atmosphere prevailing in the oven. After heating for one hour at 400° C., the substrate 5 is cooled. After the cooling of the substrate, it is removed from the oven. As a result of the heating step, a porous film 35 has formed from the composition 10. An investigation of the film using a scanning electron microscope shows that the individual pores have a diameter of less than 30 nm. The layer thickness of the layers investigated was between 200 nm and 10 µm and, when used as insulation material between metal wiring planes of a semiconductor chip, the layer is usually formed with a layer thickness of between 300 nm and 1.5 µm.

For comparison, a composition that includes only the first component 15 and not the second component 25 was applied to a substrate 5. After a corresponding thermal treatment, investigation of the applied film by scanning electron microscopy showed that no pores are formed.

The dielectric constant of the porous layer 35 formed was investigated by impedance spectroscopy. The measuring setup used was a capacitor setup that includes a silicon wafer as substrate material, a titanium layer as the first capacitor electrode, the porous layer 35 as the capacitor dielectric and a second titanium layer applied thereon as the second electrode. For the determination of the dielectric constant, a plurality of capacitor stacks having different diameters have been formed. For example, the measurement of the dielectric constant of the porous layer 35 showed that its dielectric constant is about 2.4. In comparison, the dielectric constant of a layer that was formed from the first component, but without pores, is about 2.9. This means a signal transit time reduced by at least 20%, for example, with respect to the signal transit time on a line of a semiconductor chip.

A thermal stability investigation by thermal gravimetry showed a thermal stability at temperatures of more than 480° C. for the porous layer 35 produced. The investigation was carried out using an STA 1500 from Reometric Scientific at a heating rate of 5° C. per minute and with argon as inert gas.

Investigations into the adhesion of the porous layer on a substrate have shown that the porous layer 35 adheres substantially better to a substrate 5 than a layer that was formed only from the first component and has no pores. For such a purpose, a 4-inch silicon wafer having the composition 10 described above was coated by the spin-coating technique. The spin-coating is carried out for 5 seconds at 500 rpm and for 20 seconds at 2000 rpm. After brief heating at a temperature of 110° C. for a period of 60 seconds on a hotplate, a silicon chip measuring 4×4 mm² is pressed onto the composition 10 with a force of 2 N. The configuration is then heated for 240 seconds at 180° C. on a hotplate. After cooling to room temperature, an adhesion test is carried out by a shear tester of the Dage series 400. On average, a force of 2.3 kg/mm² is required to shear off the stated silicon chip.

In comparison, the force required for shearing off in the case of a composition that includes only the first component but not the second component 25 and, therefore, forms no pores is only 1.5 kg/mm². Consequently, the composition 10 according to the invention has advantages also with respect to the adhesion prevailing on the substrate.

The adhesion of the conventional copolymer as a comparative material under identical test conditions is 1.7 kg per mm². Thus, the mixture according to the invention, including the first polymer component 15 and the second polymer component 25, has a substantially higher adhesive force than the separately prepared copolymer.

Figure 4:
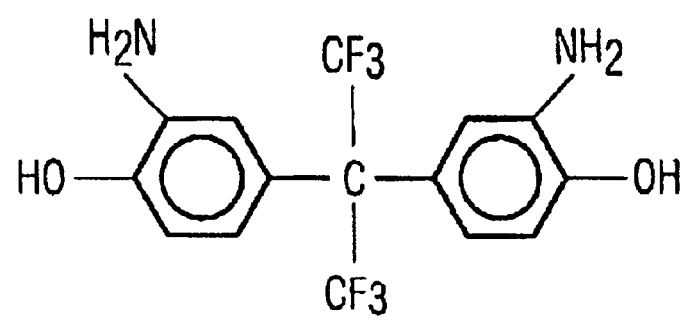
FIG. 4 is an illustration of another bisaminophenol suitable for the preparation of the composition according to the invention.

FIG. 4 shows a further bisaminophenol 2 that is suitable as a monomer component for the preparation of a polyhydroxyamide for the first polymer component. This is a 2,2-bis(3-amino-4-hydroxyphenyl) hexafluoro-propane.

The unstable second polymer component is preferably a polycarbonate or a polyacetal or aliphatic polyester or polyether. Any desired combination of the polymers suitable for the first component with polymers suitable for the second polymer component is also possible.

I claim:

1. A composition for the production of a dielectric, porous layer, comprising:

a mixture of at least one first polymer component and at least one second polymer component;

said first component selected from the group consisting of polyhydroxyamide and polybenzoxazole; and said second component being decomposable and volatilizable at temperatures at which said first component is stable;

said first component including a terminal COOH group and said second component including a terminal $NH_2$ group.

2. The composition according to claim 1, wherein said second component is a polymer selected from the group consisting of polycarbonate, polyacetal, aliphatic polyether, and polyester.

3. The composition according to claim 2, wherein said second component is poly( propylene glycol)-bis-(2-aminopropyl ether).

4. The composition according to claim 1, wherein said second component is a polyether having terminal amino groups.

5. The composition according to claim 1, wherein said first component is a polyhydroxyamide having terminal carboxyl groups.

6. The composition according to claim 1, wherein said second component is poly(propylene glycol)-bis-(2-aminopropyl ether).

7. The composition according to claim 1, wherein said first component is a polyhydroxyamide prepared from bisaminophenol 1 and isophthaloyl chloride.

8. The composition of claim 1, wherein a salt is formed by the COOH group of a polymer component containing a COON group and the $NH_2$ group of a polymer component containing a $NH_2$ group.

9. A composition for the production of a dielectric, porous layer, comprising:

a mixture of at least one first polymer component and at least one second polymer component;

said first component selected from the group consisting of polyhydroxyamide and polybenzoxazole; and said second component being decomposable and volatilizable at temperatures at which said first component is stable;

one of said components including a terminal COON group and the other of said components including a terminal $NH_2$ group.

10. The composition of claim 9, wherein a salt is formed by the COOH group of a polymer component containing a COOH group and the $NH_2$ group of a polymer component containing a $NH_2$ group.

* * * * *

UNITED STATES PATENT AND TRADEMARK OFFICE
CERTIFICATE OF CORRECTION

PATENT NO. : 6,861,479 B2
DATED : March 1, 2005
INVENTOR(S) : Recai Sezi

It is certified that error appears in the above-identified patent and that said Letters Patent is hereby corrected as shown below:

<u>Column 8,</u>
Line 48, should read as follows:
-- COOH group and the $NH_2$ group of a polymer component --
Line 59, should read as follows:
-- one of said components including a terminal COOH --

Signed and Sealed this

Fifth Day of July, 2005

JON W. DUDAS
*Director of the United States Patent and Trademark Office*